United States Patent [19]

Rhodenizer

[11] Patent Number: 4,863,758
[45] Date of Patent: Sep. 5, 1989

[54] CATALYST SOLUTIONS FOR ACTIVATING NON-CONDUCTIVE SUBSTRATES AND ELECTROLESS PLATING PROCESS

[75] Inventor: Harold L. Rhodenizer, Bethlehem, Conn.

[73] Assignee: MacDermid, Incorporated, Waterbury, Conn.

[21] Appl. No.: 54,136

[22] Filed: May 13, 1987

Related U.S. Application Data

[63] Continuation of Ser. No. 910,821, Sep. 12, 1986, abandoned, which is a continuation of Ser. No. 381,943, May 26, 1982, abandoned.

[51] Int. Cl.$^4$ .......................... B05D 5/12; B05D 3/10; B05D 1/18
[52] U.S. Cl. ........................................ 427/97; 427/98; 427/304; 427/443.1; 106/1.11
[58] Field of Search ............ 427/304, 305, 306, 443.1, 427/97, 98; 106/1.11

[56] References Cited

U.S. PATENT DOCUMENTS

| | | |
|---|---|---|
| 3,011,920 | 12/1961 | Shipley, Jr. |
| 3,532,518 | 10/1970 | D'Ottavio |
| 3,562,038 | 2/1971 | Shipley, Jr. et al. |
| 3,607,352 | 9/1971 | Fadgen, Jr. et al. |
| 3,650,913 | 3/1972 | D'Ottavio |
| 3,672,938 | 6/1972 | Zeblisky |
| 3,767,583 | 10/1973 | Fadgen, Jr. et al. |
| 3,874,897 | 4/1975 | Fadgen, Jr. et al. |
| 3,904,792 | 9/1975 | Gulla ................................. 427/304 |
| 3,961,109 | 6/1976 | Kremer et al. |
| 4,001,470 | 1/1977 | Schulze-Berge |
| 4,004,051 | 1/1977 | Kadison et al. ...................... 427/304 |
| 4,008,343 | 2/1977 | Cohen et al. |
| 4,073,981 | 2/1978 | Baron |
| 4,153,746 | 5/1979 | Kilthau |
| 4,182,784 | 1/1980 | Krulik |
| 4,204,013 | 5/1980 | Arcilesi et al. |
| 4,244,739 | 1/1981 | Cagnassi |

OTHER PUBLICATIONS

Thomas Rau, Hole Wall Pullaway—A Study, Jan. 16, 1977, Proceedings of AES Meeting, San Francisco, California.

*Primary Examiner*—Norman Morgenstern
*Assistant Examiner*—Margaret Bueker
*Attorney, Agent, or Firm*—St. Onge, Steward, Johnston & Reens

[57] ABSTRACT

Disclosed are an improved activation composition for preparing substrates for metallization in an electroless plating bath. Also disclosed is an improved process for activating substrates prior to metallization and an improved process for metallizing employing the improved activating process.

Electroless deposition, which involves chemically reducing ions of the metal to be plated from a plating bath and onto an activated substrate surface, is improved by employing an organic acid in the activating bath which activates the substrate surface. Preferred activating baths contain palladium halide ions to provide a catalytic surface on the substrate, stannous halide ions to provide a protective sol, a source of additional halide ions, and an organic acid such as citric or tartaric acids.

The composition and process enable the elimination of a typically-required acceleration step, but yet provide consistently high quality results especially with substrates having through holes requiring coating, such as printed circuit boards requiring a plating of copper.

6 Claims, 1 Drawing Sheet

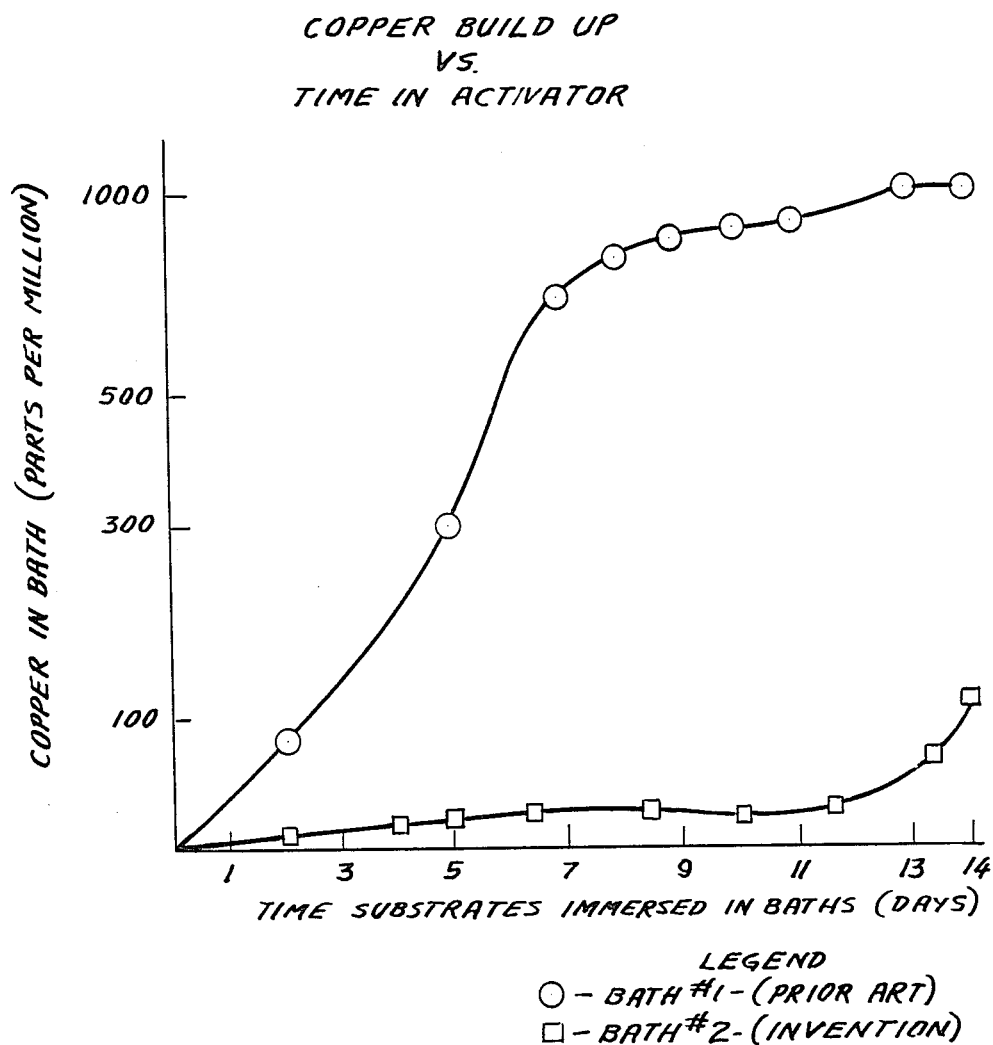

CATALYST SOLUTIONS FOR ACTIVATING NON-CONDUCTIVE SUBSTRATES AND ELECTROLESS PLATING PROCESS

This is a continuation of co-pending application Ser. No. 910,821 filed on Sept. 12, 1986, which is a continuation of U.S. application Ser. No. 381,943, filed on May 26, 1982 both now abandoned.

DESCRIPTION

The present invention relates to electroless plating, and particularly to improved catalyst solutions for activating non-conductive substrates and an improved electroless plating process.

Metallization processes for non-conductive substrates using noble metal baths as activators are well known. These processes are useful for applying decorative metal to articles such as glass and are particularly useful in metallizing printed circuit boards, especially those having holes punched or drilled therein.

In one kind of process, metal baths are used sequentially, by providing first a film of Group IV metal ion reducing agent, e.g., stannous ion, followed by a bath which provides a film of reduced precious metal, e.g., palladium, on the surface of the substrate. This process activates or sensitizes the surface of the substrate for subsequent electroless metal deposition. Various 2-step activation systems and improvements are found in the art. These processes presented problems, especially with copper clad laminates as substrates, such as inadequate metal- to-metal bonding in the subsequent electroless metal deposition, lack of uniformity of results and unstable activator baths.

These problems were somewhat solved by the use of a unitary or single step noble metal bath which catalyzes or activates the substrate by depositing a film of noble metal. However, problems remained including the need for an acceleration step following activation, the high cost of the process due to high concentration of noble metal salts, poor results in terms of pullaway at hole walls in printed circuit boards, problems involved in handling and disposal of large volumes of often hazardous chemicals, lengthy initiation times, and blistering of metal from the substrate after deposition in the case of non-metallic substrates.

Background Art

A number of prior art patents have discussed these and other problems and have offered a number of solutions. For stability, the activating baths typically contain a protective metal, the preferred embodiment being a tin-palladium sol, the tin being the protective metal, as disclosed for example by Shipley U.S. Pat. No. 3,011,920.

These unitary metal activator baths have been called colloidal or semi-colloidal in most prior art or solutions as in U.S. Pat. No. 3,672,938 to Zeblisky. Regardless of the physical description, they are all unitary noble metal sol activators as opposed to the 2-step activator systems and will be referred to herein as unitary or single step activator sols or baths. However, the presence of the protective metal causes other problems in the electroless metal deposition step, such as lengthy initiation times for metal deposition and blistering of metal from substrates after metal deposition when using nonmetallic substrates. When copper clad substrates are used, poor copper-to-copper adhesion can result after copper deposition.

Hole wall pullaway or separation of the plate composite from the hole wall of thru-holes in printed circuit boards can also be a problem. The pullaway can happen in operations subsequent to electroplating either during fusing of the tin lead coating or during soldering on components of the finished printed circuit board. Studies have shown that with elimination of acceleration, an increase in the amount of pullaway will result.

Although the acceleration step has been said to be optional, the preferred use of the protective metal necessitates the use of an acceleration step as disclosed, for example, in U.S. Pat. No. 3,011,920 to Shipley. This is particularly preferred when using the tin-palladium single step activator sol systems with copper clad laminates as substrates, and is also useful with other systems. Acceleration is also stated as preferable rather than necessary in other patents, such as U.S. Pat. No. 3,650,913 to D'Ottavio.

There are examples in the prior art where acceleration is deleted. In U.S. Pat. No. 4,073,981, to Baron which deals primarily with a coating method to allow selective metal deposition, an "inert rinse, preferably water", is used after activation. The process in this patent disclosure uses a typical single step activator bath known to the art comprising a tin-palladium sol as described in the present disclosure. However, no effort is made in the Baron disclosure to address the problems known to accompany deletion of acceleration with this activator system. As will be shown later in this present disclosure, it is one of the primary objects, of this present invention to provide a plating process "without acceleration" which solves exactly these prior art problems and retains the advantage of the palladium-tin single step activator bath.

It has been found that the acceleration step, besides adding to the length of the plating process, can cause problems itself. Poor metal coverage or voiding in the electroless deposition step can be caused by over-acceleration. It is assumed that over-acceleration removes some of the catalytic metal from the substrate while removing the protective metal, thus rendering the substrate less active to metal deposition. Conversely, under-acceleration can cause poor adhesion of metal to substrate or blistering in the electroless plating step. Novel accelerators have been developed to try to overcome this control problem, for example, in U.S. Pat. No. 4,204,013 to Arcilesi et al, the accelerator bath contains an alkyl amine, including certain amino acids.

Some modifications of the acceleration step have been found in the prior art, for example, the post-activation step in U.S. Pat. No. 3,767,583 to Fadgen et al. In U.S. Pat. No. 3,562,038 to Shipley et al, stripping for selective plating provides a modified acceleration step. In U.S. Pat. No. 4,008,343 to Cohen et al, an acid rinse is used after activation followed by a water rinse.

Considerable effort has been directed towards improvement of single-step activator baths. In the disclosure of U.S. Pat. No. 4,001,470 to Schulze-Berge, tin is replaced as the protective metal in the activator bath by gum arabic and/or gelatin. The activator bath also contains at least one carboxylic acid and the acceleration step is deleted.

Other efforts deal with retaining tin as the protective metal for the catalytic metal and altering or adding to the rest of the activator bath.

In U.S. Pat. No. 4,182,784 to Krulik, the tin-palladium sol is used and "no halide outside of the tin-palladium salts is present in the bath". Here a hydroxy-substituted organic acid is used to stabilize the bath instead of an excess halide. Acceleration in an acid or a base is included in the cycle. In U.S. Pat. No. 3,767,583 to Fadgen et al, the tin-palladium salts activator bath contains a "1–4C alkanol". A post activation or acceleration step is included to "assure exposure of the catalytic noble metal on the surface or surfaces". In U.S. Pat. No. 3,961,109 to Kremer et al, phenol or aromatic alcohol type compounds are used as additives to the activator bath. Acceleration in fluoboric acid is included. In U.S. Pat. No. 4,153,746 to Kilthau, EDTA is used as an additive at a specified low pH although EDTA shows very little solubility at this low pH. A stripping step is included after activation. These additives are directed primarily towards either improving the stability, efficiency and life of the activator bath or providing better activation for electroless deposition. And, in U.S. Pat. No. 4,244,739 to Cagnassi, the activator solution comprises an aliphatic sulphonic acid as at least part of the acid. Again, however, the use of an acceleration step is disclosed employing fluoboric acid.

Insofar as is known to the Applicant, there has not been provided a noble metal-protective metal activator bath, of the palladium-tin type which can be used in a plating process without acceleration to provide consistently good results.

Disclosure

According to this invention, there is provided a composition for activating a substrate for electroless metallization, comprising: a noble metal that is catalytic to a chemical reduction plating process, salts capable of forming a protective metal sol in water, a source of halide ions in excess of that provided by the noble metal and salts for forming the protective metal sol, and at least one organic acid, which is substantially soluble in the plating bath, selected from the group consisting of aliphatic carboxylic acids, aromatic carboxylic acids, amino acids and combinations of these.

The invention is preferably employed for electrolessly plating copper and nickel, most preferably copper, but can also be employed for activating substrates prior to plating gold, palladium, and cobalt. This invention also comprehends the use of the above activator sols in an overall combination of steps constituting a complete chemical plating system which combination provides not only fewer steps than the conventional system, but comparable or improved results.

There were many unexpected advantages found as testing of this invention progressed and prior art problems were addressed, especially when using copper-clad laminates as substrates. Some advantages of this invention over the prior art were found to be:

1. The traditional acceleration step and rinse following are deleted when using the activator of this invention without problems encountered in the prior art, such as blistering of metal to substrate, slow initiation times in the electroless plating step when using non-metallic substrates and poor copper-to-copper adhesion when using copper clad laminates as substrates. There is no increase of hole wall pullaway on thru-holes which can be a major cause of rejected printed circuit boards. With the activator of this invention, several copper electroless plating baths were used without acceleration, and results were good with all baths. Thus, two steps are removed from the prior art plating process making for easier and less expensive operation. An additional important advantage of deleting the acceleration step is the elimination of a waste disposal process for the acceleration bath and subsequent rinse. This procedure can be costly, time-consuming and hazardous. For example, fluoboric acid is typically used for acceleration. Fluoride ion in solution in itself is very corrosive and must be handled with great care. Protective clothing and goggles must be worn for any handling of the bath including waste disposal. Waste disposal also involves slowly and carefully neutralizing with a base to a pH of 7. This reaction generates heat and can be dangerous. Other acceleration baths can provide similar waste disposal problems.

2. There is less copper build-up in the activator bath of this invention with copper clad laminates as substrates than with the prior art bath. It is assumed that the organic acid additive acts as a copper complexor for the copper removed from the cladding during activation. The bath of this invention thus can be used longer before disposal because of less copper build-up again making for less waste disposal and less expensive operation.

3. A lower noble metal concentration is used in the working activator bath of this invention compared to the conventional bath, making the bath less expensive to operate.

4. Although the preferred embodiment of this invention uses copper clad laminates as substrates and copper electroless plating baths commonly found in the preparation of printed circuit boards, a variety of substrates and nickel electroless plating baths were tested with the activator bath of this invention and good results were observed.

5. A common form of substrate used in the printed circuit industry consists of a combination of surfaces, commonly, a composite of copper clad laminate and a non-metallic portion such as phenolic or epoxy. It is desirable for this type of substrate to electrolessly plate a greater amount of copper on the non-metallic portion than on the copper-cladding since the plated copper is needed primarily on the non-metallic thruholes. When using the activator bath and plating process of this invention, this is achieved with results superior to the prior art activator bath and plating process.

The activator baths which are used for prior art comparison in the examples, are commonly used in an electroless plating cycle which includes the acceleration step followed by various electroless metallization baths. These activator baths comprise palladium chloride, stannous chloride, sodium chloride, and/or hydrochloric acid without the organic acid of this invention.

A variety of copper electroless plating baths were used to show the versatility of this invention. These baths are commercially available and are known as MacDermid Copper baths: Metex Electroless Copper 9048, Metex Copper 9027, MACu Dep 20, and MACu Dep 60, and have the following common usages in the Art: Metex Electroless Copper 9048 is a high speed bath run at about 130° F. Metex Copper 9027 is a high speed room temperature bath. MACu Dep 60 is a medium temperature (about 100° F.) high speed bath. MACu Dep 20 is a room temperature, slow speed bath. High speed provides a thicker metal film than slow speed in the same time. They are used depending on production needs.

These copper baths include the major components of electroless copper baths and comprise: a solvent, usually water; a source of cupric ions; a source of hydroxide ions; a complexor or chelator, such as EDTA, to maintain the copper in solution; and a reducing agent, such as formaldehyde.

BRIEF DESCRIPTION OF THE DRAWINGS

The invention will be better understood and its advantages will become more apparent from the following detailed description, especially when read in light of the Examples and the attached drawing, wherein: The FIGURE shows a graphic representation of the data obtained according to the comparison of Example 33. The graph shows copper buildup as a function of time in an activation bath according to the invention which employs an organic acid, and a prior art bath not containing organic acid.

BEST MODE FOR CARRYING OUT THE INVENTION

The activator bath prepared according to D'Ottavio in U.S. Pat. No. 3,532,518 is a sol which comprises water, hydrochloric acid, stannous chloride, sodium stannate and palladium. The preferred activator baths of this invention are prepared by dilution of this so with water before use, and the inclusion of an organic acid selected from the group consisting of aliphatic carboxylic acids, aromatic carboxylic acids, amino acids, and combinations of these.

The preferred range of concentrations encompasses from about 0.0398 to about 0.1194 gm./l. palladium and from about 2 to about 6 gm./l. stannous ion. However, workability is not limited to this range, but encompasses from about 0.02 gm./l. to about 8 gm./l. palladium and from about 1 gm./l. to about 300 gm./l. stannous ion.

Additional chloride salt and/or chloride acid is added. Preferable chloride normalities of the activator bath of the invention range from about 3.4 to about 4.6 normal. Chloride normalities for workability range from about 0.1N to saturation.

The activator bath of this invention comprises one or more organic acids, such as tartaric, citric, maleic, malonic, glycolic, and gluconic, as illustrated in the examples, the preferred acids being tartaric and/or citric acids. Also effective are glutaric acid, glycine, and salicylic acid. The workable concentration of the organic acid or acids is limited on the upper range only by saturation in the bath. It is obvious that at saturation, results will not be improved by additional organic acid. Any amount of organic acid added to the bath improves results, from about 1 gm./l to saturation, maximum results being attained at from about 10 to about 80 gm./l. of organic acid.

The preferred embodiment of this invention comprises 10% by volume hydrochloric acid, 7.5 gm./l. tartaric acid, and 3.0 gm./l. citric acid in water. The bath also comprises about 0.0597 gm./l. palladium and about 3 gm./l. stannous ion. Chloride normality of about 3.6N is obtained by addition of sodium chloride.

The plating process of this invention comprises first cleaning the nonconductive substrate with suitable cleaners known to the art, followed by appropriate rinses. The substrate then is usually etched with a chemical etchant, several of which are commercially available for this purpose, in order to prepare the surface for reception of the activating metal. Acid dips, neutralizers, and water rinses may be included before and after etching if applicable. The etched substrate is then contacted with the activator of this invention for from about 2 to about 5 minutes and water rinsed for about 3 minutes, although these times may vary somewhat. A predip in a bath containing halide ions may be included before activation. The substrates are next chemically plated, and any number of electroless metal compositions and methods known to the art can be used. This then can be followed if desired, by electroplating in the conventional manner with copper or any other desired metal.

The process of this invention differs substantially from the traditional prior art plating process which typically requires an acceleration step, usually in an acid after the activation step. A water rinse is also usually included after acceleration before electroless metallization. A prior art noble metal-protective metal (usually palladiumtin) activator bath which does not include the organic acid of this invention is used in the prior art plating process in the comparisons below.

The following non-limiting examples illustrate the composition and method of this invention along with some of the principal advantages thereof:

EXAMPLE 1

A specific embodiment of the plating process of this invention comprises the following process cycle:
1. Soak clean in MacDermid's Metex 9267 cleaner, 150° for 4 minutes. and 3. Counterflow rinses, 2 minutes each tank.
4. Acid Dip, sulfuric acid, 10% by volume, 70° F., 2 minutes.
5. Rinse with water.
6. Etch with MacDermid Metex PTH Etch G-5, 110° F., 2 minutes.
7. Rinse with water.
8. Acid dip, sulfuric acid, 10% by volume, 70° F., 2 minutes.
9. Rinse with water.
10. Activate with the activator of this invention in its preferred embodiment, 80° F., 3 minutes.
11. Rinse with water, 2 minutes.
12. Electroless copper plate with MacDermid MACu Dep 60 copper bath.

The activator bath of this invention in its preferred embodiment, comprising 0.0597 gm./l. palladium, 3 gm./l. stannous ion, 7.5 gm./l. tartaric acid, and 3.0 gm./l. citric acid, was prepared for use in a 30 gal. tank. Chloride normality of the bath was maintained at 3.5 to 4.5N. The plating cycle of this invention as described above was used. The control cycle for the purposes of prior art comparison was a commercially available prior art plating cycle known as MacDermid Metex PTH Process which includes an acid acceleration bath, Metex PTH Accelerator 9071. The control cycle contained a commercially available activator bath, MacDermid Metex PTH Activator 9070 (D'Ottavio U.S. Pat. Nos. 3,532,518 and 3,650,913). The substrates used were copper clad laminate production printed circuit boards with thru-holes. Half of the boards were run through the cycle of this invention and the other half through the control cycle which was in use for production at the time of this testing procedure. Times and temperatures were the same for both cycles as were the compositions of the bath except for the activator baths and the accelerator bath for the control cycle. Both sets of boards were electrolessly plated in a commercially available copper bath, MacDermid MACu Dep 60. Copper coverage and copper-to-copper adhesion were found to be substantially the same on both sets of boards. After electroless copper plating, the boards were electrolytically copper plated and then electroplated with tin-lead. After fusing of the tin-lead coating by the infrared method, thruholes were subjected to a solder-shock test which consists of immersion in 550° F. solder for 10 seconds. Cross-sections were taken and examined. The incidence of hole wall pull-away was the same for both sets of boards. No voiding was observed in either set of boards. The number of rejected finished boards was also substantially the same for both sets of boards. The cycle and activator bath of this invention showed results comparable to the commercial prior art activator bath and cycle and have the advantage of deleting the acceleration step and subsequent rinse.

EXAMPLE 2

(Prior Art Activator Bath —No Acceleration)

For purposes of comparison, an activator bath was prepared using the preferred concentration of palladium, stannous ion, and chloride without the organic acid of this invention. The plating process of this invention as stated in Example 1 was used with the above prior art bath. Copper clad substrates were used. Blistering of the copper from the copper-clad substrate was observed after electroless deposition on all samples. The prior art activator bath which does not contain the organic acid of this invention gives poor results when used with the plating process of this invention.

EXAMPLES 3-5

Activator baths of this invention in its preferred embodiment were prepared with chloride normalities of 3.4, 3.6, and 4.6. The plating process of this invention as stated in Example 1 was used with copper clad substrates. Copper-to-copper adhesion was found to be good on all samples after copper deposition.

EXAMPLES 6-13

The plating process of this invention as stated in Example 1 was used for Examples 6-11. All substrates were electroless plated in Metex Copper 9027.

MacDermid Metex PTH Accelerator 9074 was used for prior art comparison (Examples 12 and 13). The plating cycle used for Examples 12 and 13 was MacDermid Metex PTH Process.

The amount of copper deposited on the substrate was measured in average microinches of copper coverage after electroless deposition. For the activator baths with the preferred range of concentrations of palladium, stannous ions, and tartaric acid and the plating process of this invention the data shows 16 to 18 microinches more copper is deposited on the epoxy surface than on the copper clad surface in the same deposition time (Examples 6-11, Table I). Using the prior art activator bath and plating process, the data (Examples 12 and 13) shows that 9 microinches more of copper is deposited on the epoxy than the copper clad substrate in the same deposition time. The larger differential is advantageous when printed circuit boards having composite copper clad and epoxy or non-metallic surfaces are used as substrates, since it is the epoxy that is important to be plated, not the copper cladding.

TABLE I

| Ex. | Cl− Normality | Activator Bath Pd++ concentration (gm./l.) | Sn++ concentration (gm./l.) | Tartaric acid (gm./l.) | Cu deposition (Micro inch) | Time in Electroless Cu bath (Mins.) | Acceleration |
|---|---|---|---|---|---|---|---|
| 6. Cu clad laminate | 3.6 | .0398 | 2 | 10 | 30 | 10 | No |
| 7. Epoxy | 3.6 | .0398 | 2 | 10 | 46 | 10 | No |
| 8. Cu clad laminate | 3.6 | .0597 | 3 | 10 | 30 | 10 | No |
| 9. Epoxy | 3.6 | .0597 | 3 | 10 | 48 | 10 | No |
| 10. Cu clad laminate | 3.6 | .1194 | 6 | 10 | 30 | 10 | No |
| 11. Epoxy | 3.6 | .1194 | 6 | 10 | 46 | 10 | No |
| 12. Cu clad laminate | 3.4 | .1194 | 6 | 0 | 34 | 10 | Yes |
| 13. Epoxy | 3.4 | .1194 | 6 | 0 | 43 | 10 | Yes |

EXAMPLES 14-18

Activator baths of this invention comprising 0.0597 gm./l. palladium, 3 gm./l. stannous ions, and a chloride normality of 3.4N were prepared. The plating process of this invention as stated in Example 1 was used. Epoxy panels were used as substrates. Various concentrations of tartaric acid were used in the activator baths. Metex Copper 9027 was used for electroless deposition. All substrates were held in the copper plating bath for three minutes.

TABLE II

| Example | Tartaric acid (gm./l.) | Cu deposition (microinches) |
|---|---|---|
| 14 | 0 | 11 |
| 15 | 10 | 14 |
| 16 | 20 | 14 |
| 17 | 40 | 15 |
| 18 | 80 | 14 |

Examples 15-18 (invention) showed more copper deposited than Example 14 (prior art) which has no tartaric acid in the activator bath. With all samples, no acceleration was used in the plating cycle. In a short plating time (3 minutes), more copper was deposited on the epoxy substrates when the activator bath of this invention was used than when the prior art activator bath was used.

EXAMPLES 19–30

Activator baths of this invention were prepared comprising 0.1194 gm./l. palladium and 6 gm./l. stannous ion, having a chloride normality of 3.6N with each bath containing 10 gm./l. of one of the following acids: tartaric, citric, maleic, malonic, glycolic, gluconic. Copper clad substrates were subjected to the plating process of this invention as described in Example 1 using the above described activator baths. Two commercially-available electroless copper baths were used, Metex Copper 9027 and MACu Dep 20. The substrates were inspected for copper-to-copper adhesion after electroless plating. Good adhesion was found with all samples. The organic acids chosen to be tested were indicative of a range of aliphatic carboxylic acids including hydroxy substituted and some that were not hydroxy substituted. It is obvious that usefulness would not be limited to the acids in this example, but would encompass other aliphatic carboxylic acids.

EXAMPLE 31–32

Activator baths comprising 0.1194 gm./l. palladium, 6 gm./l. stannous ion, and 10 gm./l. of an aromatic carboxylic acid such as salicylic acid or an amino acid such as glycine were prepared. Chloride normalities were 3.6N. The procedure of Example 19 was followed with these baths and subsequent electroless deposition of copper.

EXAMPLE 33

(Prior Art and Invention Copper Build-up in Activator Bath)

Two activator baths were prepared. Bath #1 (prior art) comprises a commercially-available activator bath, MacDermid Mactivate 10 which comprises 0.0597 gm./l. palladium and 3.0 gm./l. stannous ion and had a chloride normality of 3.6N. Bath #2 (invention) comprises the preferred embodiment of this invention, comprising 0.0597 gm./l. palladium and 3.0 gm./l. stannous ion. Chloride normality is 3.6N. Bath #2 also comprises 7.5 gm./l. tartaric acid and 3.0 gm./l. citric acid. A series of copper clad substrates were immersed in both baths for the same length of time. Copper build-up in the baths in ppm was measured by the atomic absorption method. Bath #2 (invention) showed significantly less copper build-up than Bath #1 (prior art). The copper buildup in the baths is shown in the attached FIGURE.

EXAMPLE 34

(Prior Art —Palladium Concentration of Activator Bath)

An activator bath comprising 7% MacDermid Metex PTH Activator 9070 (D'Ottavio U.S. Pat. Nos. 3,532,518 and 3,650,913) was prepared. Analysis showed working bath concentrations to be 0.0597 gm./l. palladium and 3 gm./l. stannous ion. Chloride normality was 4.6N. Copper clad laminates were subjected to the commercially-available MacDermid Metex PTH plating process which differs from the plating process of this invention by inclusion of the acceleration step in Metex PTH Accelerator 9071. Absorption data showed 0.69 mg./sq. cm. palladium and 0.8 mg./sq. cm. tin on the substrates after the activation. After electroless copper plating, the substrates had a dark pink color and poor metal coverage, especially on the edges of the substrate.

EXAMPLE 35

(Invention —Palladium Concentration of Activator Bath)

An activator bath of this invention in its preferred embodiment, comprising 0.0597 gm./l. palladium and 3 gm./l. tin, chloride normality of 3.6N, 7.5 gm./l. tartaric acid and 3.0 gm./l. citric acid was prepared. Copper clad laminates were subjected to the plating process of this invention. Analysis verified that the bath contained 0.0597 gm./l. palladium and 3 gm./l. stannous ion. Absorption data showed 0.8 mg./sq. cm. palladium and 2076 mg./sq. cm. tin on the substrate after activation. Good copper coverage and no voids were found after electroless copper plating.

The activator bath of this invention gives good results at a lower working concentration of palladium using the plating process of this invention which does not include acceleration compared to the prior art activator bath used in the prior art plating process which includes acceleration.

EXAMPLE 36

Substrates consisting of panels of ABS plastic and epoxies were subjected to the activator bath of this invention in its preferred embodiment and the plating process of this invention. A commercially available nickel bath was used for electroless plating known as MacDermid MACuplex 9340 Electroless Nickel. The plating process used comprised subjecting the substrates to the following steps:

1. Chrome etch with MacDermid L-56 for 5 minutes at 155° F.
2. Cold water rinse, 3 minutes.
3. MacDermid Metex 9337 Neutralizer, 2 minutes.
4. Cold water rinse, 3 minutes.
5. Activate with the activator of this invention in its preferred embodiment for 3 minutes, at 80° F.
6. Cold water rinse, 3 minutes.
7. Electroless nickel, MACuples 9340 Electroless Nickel, 80° F., 5 minutes.

Good nickel coverage and adhesion of nickel to substrate were observed after electroless deposition.

The above description has been for the purpose of teaching the person skilled in the art how to practice the invention. It is not intended to describe in detail each and every obvious modification and variation thereof. It is intended, however, that all such modifications and variations be included within the scope of the invention which is defined by the following claims.

I claim:

1. A composition for activating a substrate for electroless metallization comprising: at least one salt of a noble metal that is catalytic to chemically reducing dissolved salts of the metal to be plated in an electroless plating bath, salts capable of forming a protective metal sol in water, a source of halide ions in excess of that provided by the noble metal salts and salts for forming the protective metal sol, and at least one acid selected from the group consisting of citric, tartaric and combinations of these.

2. A composition for activating a non-conductive substrate for plating with a metal selected from the group consisting of nickel and copper by electroless deposition from an electroless plating bath comprising dissolved salts of the metal to be plated, without an acceleration step, the composition comprising: water, palladium halide salt; stannous halide salt; a source of halide ions in addition to the palladium and stannous halide salts; ad at least one organic acid, soluble in the plating bath, selected from the group consisting of citric, tartaric and combinations of these acids.

3. A composition according to claim 2 wherein the chloride concentration is within the range of from about 0.1 normal to saturation, the palladium concentration is within the range of from about 0.02 to about 8 grams per liter, and the stannous ion concentration is within the range of from about 1 to about 300 grams per liter.

4. A process for activating a substrate for electroless metallization in an electroless deposition plating bath containing reducible ions of the metal to be plated, the process comprising: contacting a substrate with an aqueous activating bath comprising at least one salt of a noble metal capable of catalyzing the chemical reduction of the ions of the metal to be plated, salts capable of forming a protective metal sol in water, a source of halide ions in excess of that provided by he noble metal salts and salts for forming the protective metal sol, and at least one aliphatic acid, soluble in the plating bath, selected from the group consisting of citric, tartaric and combinations of these acids.

5. A process for plating a non-conductive substrate having through holes therein, comprising: contacting a substrate with an aqueous activating bath comprising at least one salt of a noble metal capable of catalyzing the chemical reduction of the ions of the metal to be plated, salts capable of forming a protective metal sol in water, a source of halide ions in excess of that provided by the noble metal salts and salts for forming the protective metal sol, and at least one aliphatic acid, soluble in the plating bath, selected from the group consisting of citric, tartaric and combinations of these acids; and, without subjecting the substrate to an accelerating treatment, contacting the substrate in an electroless deposition plating bath containing reducible ions of the metal to be plated.

6. A process according to claim 5 wherein the non-conductive substrate has through holes therein.

* * * * *